United States Patent [19]

Rung

[11] Patent Number: 4,605,872
[45] Date of Patent: Aug. 12, 1986

[54] PROGRAMMABLE CMOS CIRCUIT FOR USE IN CONNECTING AND DISCONNECTING A SEMICONDUCTOR DEVICE IN A REDUNDANT ELECTRICAL CIRCUIT

[75] Inventor: Robert D. Rung, Corvallis, Oreg.

[73] Assignee: Tokyo Shibaura Denki Kabushiki Kaisha, Kanagawa, Japan

[21] Appl. No.: 558,455

[22] Filed: Dec. 6, 1983

[30] Foreign Application Priority Data

Dec. 9, 1982 [JP] Japan ................. 57-214609

[51] Int. Cl.$^4$ .......................... H03K 17/12
[52] U.S. Cl. .................... 307/465; 307/441; 307/446; 307/451; 307/466; 307/469; 307/570; 307/585; 307/252 A; 357/38; 357/43
[58] Field of Search ............. 307/441, 446, 450–451, 307/465–466, 468–469, 219, 570, 579, 581, 584–585, 252 A, 252 H, 270, 284; 340/825.83, 825.84; 365/96; 357/42, 43, 38

[56] References Cited

U.S. PATENT DOCUMENTS

| | | | |
|---|---|---|---|
| 3,792,319 | 2/1974 | Tsang | 340/166 X |
| 4,122,547 | 10/1978 | Schoeder et al. | 365/96 X |
| 4,130,889 | 12/1978 | Chua | 365/96 |
| 4,192,016 | 3/1980 | Taylor | 307/465 X |
| 4,199,731 | 4/1980 | Taylor et al. | 307/466 X |
| 4,399,372 | 8/1983 | Tanimoto et al. | 365/96 X |
| 4,417,154 | 11/1983 | Kuo | 365/96 X |

OTHER PUBLICATIONS

Ewald et al., "Fusible Link Device", IBM Tech. Disc. Bull., vol. 19, No. 8, Jan. 1977, pp. 3089–3090.
J. Tihanyi, "Functional Integration of Power MOS and Bipolar Devices", *IEEE*, 1980, pp. 75–78.
L. Leipold et al., "A FET-Controlled Thyristor in SIPMOS Technology", *IEEE*, 1980, pp. 79–82.
K. Kokkonen et al., "Redundancy Techniques for Fast Static RAMs", 1981 IEEE International Solid-State Circuits Conference, pp. 80–81.
D. Greve, "Programming Mechanism of Polysilicon Resistor Fuses", IEEE Transactions on Electron Devices, vol. ED-29, No. 4, Apr. 1982, pp. 719–724.
D. Greve et al., "Polysilicon n+p−n+ Structures for Memory Redundancy", IEEE Transactions on Electron Devices, vol. ED-29, No. 8, Aug. 1982, pp. 1313–1318.
T. Mano et al., "A 256K RAM Fabricated with Molybdenum-Polysilicon Technology", 1980 IEEE International Solid-State Circuits Conference.
R. Cenker et al., "A Fault-Tolerant 64K Dynamic RAM", 1979 IEEE International Solid-State Circuits Conference.

*Primary Examiner*—Stanley D. Miller
*Assistant Examiner*—D. R. Hudspeth
*Attorney, Agent, or Firm*—Banner, Birch, McKie & Beckett

[57] ABSTRACT

A programmable circuit is described which is particularly well suited for programming or customizing redundant elements in CMOS integrated circuits. This programmable circuit, which is formed on a semiconductor substrate together with a redundant semiconductor device, uses a parasitic switching device on the semiconductor substrate to deselect the redundant semiconductor device in response to a programming signal. The programmable circuit includes an input terminal to receive the programming signal, a parasitic SCR formed on the semiconductor substrate and coupled to the input terminal and a deselect device such as a fuse or antifuse to deselect the redundant semiconductor device. The parasitic SCR is actuated in response to the programming signal and the deselect device is connected to the SCR and the semiconductor device to deselect the semiconductor device from the redundant electrical circuit in response to the actuation of the SCR by the programming signal.

18 Claims, 17 Drawing Figures

PROGRAMMABLE CMOS CIRCUIT FOR USE IN CONNECTING AND DISCONNECTING A SEMICONDUCTOR DEVICE IN A REDUNDANT ELECTRICAL CIRCUIT

BACKGROUND OF THE INVENTION

This invention relates to a programmable circuit constituted by a semiconductor integrated circuit, and more particularly, to a programmable circuit suitable for use in programming or customizing elements in CMOS integrated devices and circuits.

The programming of redundant or customizing elements in semiconductor devices and circuits has been found to be very useful in many types of semiconductor products, including, but not limited to, PROM, EPROM, EEPROM, DRAM, and SRAM (static RAM). Programmable elements can be used to store data or microcode, customize the address of a chip in a system, allow partial use of a large chip which contains imperfections, replace faulty elements in a circuit with functional spare elements, or perform numerous other permanent or temporary (e.g., when the programmable element is an EPROM or EEPROM device) changes in a circuit at some time after completion of fabrication, and, in some cases, after assembly, shipment or installation.

The main programmable elements in current use, as ascertained from the technical literature, are (I) fusible links, typically of metal, metal alloys, heavily doped semiconductors, e.g., n++ polysilicon or metal-semiconductor alloys, e.g., molybdenum disilicide; (2) elements which act in a manner complementary to fuses, i.e., which can be programmed from a nonconducting state to a conducting state; (These will be referred to as "antifuses." An example of such an element is a link of polysilicon consisting of a p− region between two n++ regions. Under high current breakdown conditions, this element can reportedly be changed from a very high resistance ($10^9$ ohms) to a much lower ($10^3$-$10^4$ ohms) resistance); and (3) EPROM or EEPROM devices where high field charge injection can significantly alter an FET threshold voltage, hence conductance under bias conditions. Of these three basic types of programmable elements, type (1) is almost universally available, i.e., in all semiconductor processes, type (2) typically requires processing beyond what is available in most semiconductor processes, and type (3) is only available in specialized EPROM or EEPROM processes, or else necessitates significant process and circuit modifications in order to be included in more general processes and circuits. These facts explain the typical preference (greatest number of applications cited) for fusible links as programmable elements. Similarly, for use in general processes, antifuses, although less common than fusible links, tend to be more often used than EPROM or EEPROM devices.

In addition to a choice of programmable elements, there are also alternatives for programming methods, except for the EPROM and EEPROM elements which are programmed by electrical methods typical of those used in EPROM products. The two overwhelmingly preferred methods for programming fuses and antifuses are (1) high current electrical programming by means of special circuits incorporated on the chip, and (2) direct heating and/or explosion by application of a carefully aligned laser beam of very small spot size. Essentially equivalent to the second method, but apparently not yet in actual production, is programming by means of electron, ion or other energetic non-optical beams. Both the electrical and laser methods have advantages and disadvantages, the most important of which are described below.

Advantages of electrical programming are: (1) no special equipment or additional investment are required; (2) programming is very easy and rapid; (3) testing, programming and retesting can be done easily in a single automated step, i.e., no additional difficulty relative to normal testing; (4) programming can be done with or without openings in the passivation, aiding reliability and avoiding post-cleaning and additional passivation; (5) damage to nearby circuit elements is easily avoided; and (6) the possibility exists for programming after assembly, or at any time during the life of the product. Advantages of laser programming include: (I) no on-chip programming circuitry is required, thus saving area and some design effort; (2) no large devices, extra pads, or higher than normal voltages are needed to supply the energy for programming; and (3) no need exists to connect one terminal of every programmable element to a power supply or other common node, thus providing greater flexibility for the design of circuitry to sense whether or not programming has taken place.

Disadvantages of electrical programming are: (1) chip area is required for programming circuitry, particularly for the large devices needed to switch the programming current; (2) extra probe pads and voltages in excess of normal operating levels are often required for programming and to keep the switching devices from being excessively large; and (3) in order to avoid large numbers of extra pads or additional large switching devices, it is necessary to connect one terminal of all elements to a power supply or other common node. Disadvantages of laser programming are: (1) expensive and complex equipment is required; (2) programming is a very difficult step, requiring accurate wafer alignment which, unlike normal testing alignment, is years away from being completely automatic; (3) testing, programming and retesting can be done in one step, but wafer probing is made more difficult than in normal testing due to limited optics; (4) programmable elements must usually be left unpassivated for the laser step, necessitating post-cleaning and additional passivation processing; (5) damage to nearby elements can easily occur, and must thus be prevented by careful process control; and (6) programming can only be done practically at the wafer level, thus precluding any possibility of later repair or customization.

SUMMARY OF THE INVENTION

It is an object of the present invention to reduce or eliminate some or all of the above mentioned disadvantages associated with electrical programming so that its desirability relative to laser programming would substantially increase. In this regard, it is an object of this invention to provide a programmable circuit that is immediately applicable to CMOS products, including the major redundancy application field of CMOS and NMOS/CMOS static RAM, and bipolar products.

It is a further object of the present invention to provide a programmable circuit that can be made applicable to NMOS products, the major remaining category, by means of additional processing. Thus, potential applications of the programmable circuit of the present invention include customizing and redundancy implementation in all types of random logic, microprocessors, static RAM, dyanmic RAM, ROM, PROM, EPROM, EEPROM, and other products, all of which are subject to CMOS implementation.

Another object of the present invention is to provide a programmable circuit which has a small area and does not require a large transistor to provide the programming current because the CMOS latch-up phenomenon is used. Along these lines, it is an object of the present invention to provide a programmable circuit which requires a low supply voltage, yet generates a large current for fast operation.

The present invention is directed to a programmable circuit for a semiconductor device formed on a semiconductor substrate for use in a redundant electrical circuit. The programmable circuit of the present invention includes an input terminal which receives a programming signal. An SCR, which is formed on the semiconductor substrate and coupled to the input terminal, is actuated in response to the programming signal. The SCR is parasitic to the semiconductor device and intrinsic to the structure of the semiconductor substrate; the SCR on the semiconductor substrate is formed by the combination of npn and pnp bipolar transistors which are parasitic to the semiconductor device on the semiconductor substrate and intrinsic to the semiconductor substrate itself. A connect device or a disconnect device is connected to the SCR and the semiconductor device for connecting or disconnecting the semiconductor device from the redundant electrical circuit in response to the actuation of the SCR by the programming signal. The connect device or the disconnect device may be a fuse or antifuse.

DETAILED DESCRIPTION OF THE PREFERRED EMBODIMENTS

In order to electrically program a deselect device such as a fuse or antifuse, a very low on-resistance switch which occupies very little area is required. Unfortunately, commonly used integrated devices, particularly MOSFET's, are very poor switches. On the other hand, a thyristor or SCR can be an excellent switch since it has very low on-resistance and it occupies a small area. SCRs are readily available without process modification in bulk CMOS processes of all types and in bipolar processes. For example, a programmable circuit using an SCR to electrically program a deselect device (fuse or antifuse) is described below for a p-well type bulk CMOS process. However, it would be apparent to one skilled in the art how to implement the method using other bulk CMOS processes (e.g., n-well) or bipolar processes.

Figure 1:
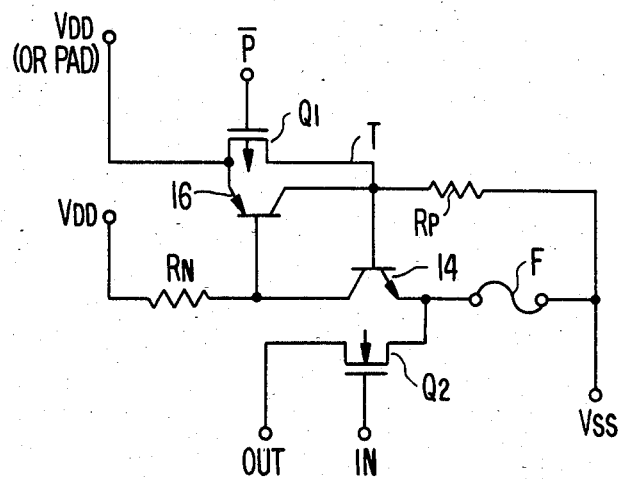
FIG. 1 is a circuit diagram showing the first embodiment of the present invention.
Figure 3:
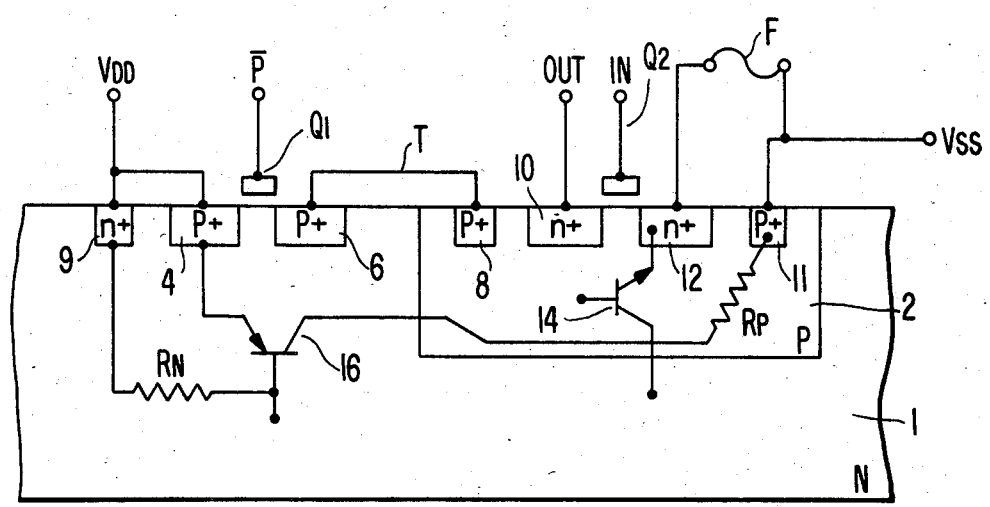
FIG. 3 is a sectional view along line A—A' of FIG. 2.
Figure 2:
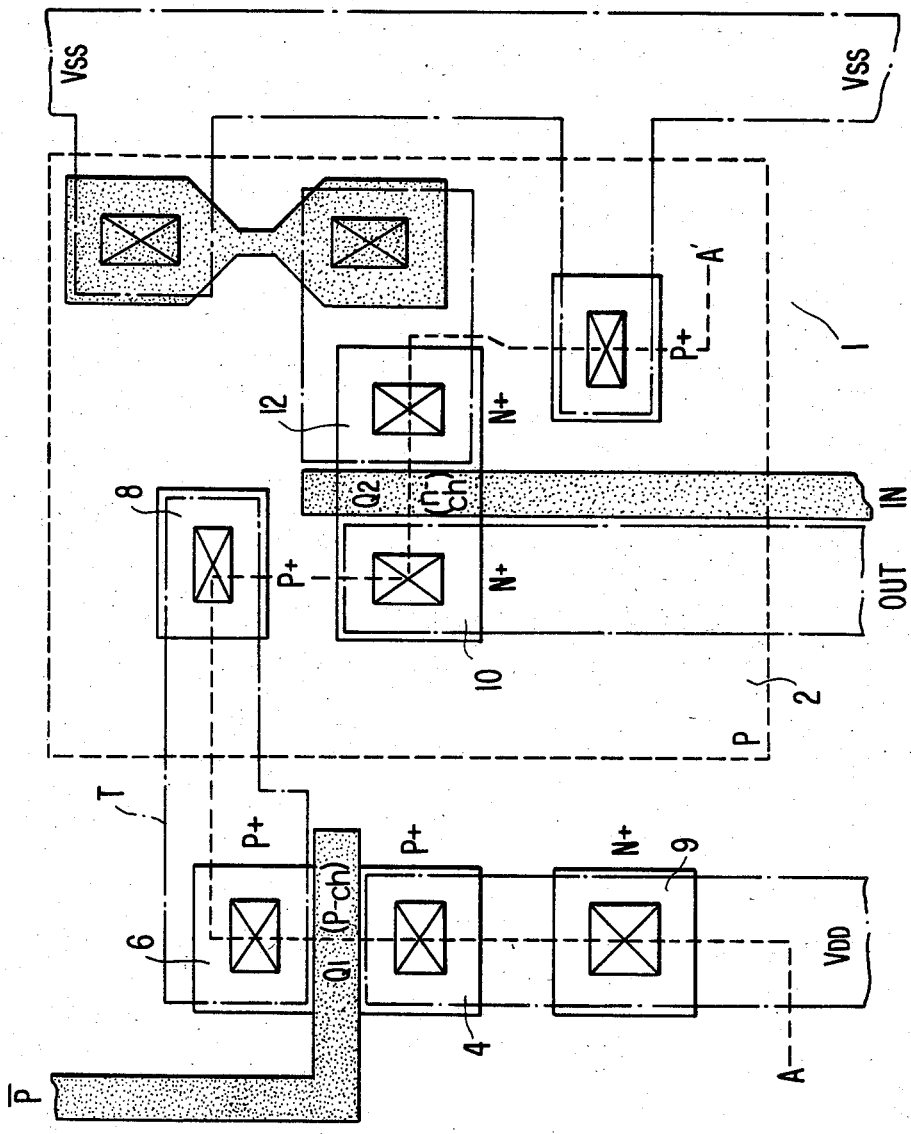
FIG. 2 is a plan view of the first embodiment of the present invention.

FIGS. 1-3 show the first preferred embodiment of the present invention. A circuit schematic illustrating the first embodiment is shown in FIG. 1, a corresponding layout is shown in FIG. 2 and a corresponding sectional view along line A—A' of FIG. 2 is shown in FIG. 3. Additional circuit schematics and corresponding sectional views are shown in FIGS. 4-17, which illustrate a few possible variations on the preferred embodiment. Since it would be apparent to one skilled in the art to adapt the layout of FIG. 2 to match the schematics shown in FIGS. 4-17, layouts for each of the modifications illustrated in FIGS. 4-17 are not given.

Turning now to FIG. 1, a programmable circuit is shown for a semiconductor device, such as MOSFET $Q_2$, in a redundant electrical circuit. The MOSFET $Q_2$ may form part of a RAM circuit or other electrical circuit (not shown) in which MOSFET $Q_2$ is a redundant component having input terminal IN and output terminal OUT. The programmable circuit includes an input terminal which receives a programming signal, such as logic signal $\overline{P}$ which is generated by conventional circuit techniques. The input terminal is connected to the gate of MOSFET $Q_1$ and voltage source $V_{DD}$ is connected to the drain. As shown in FIGS. 2 and 3, MOSFETs $Q_1$ and $Q_2$ are formed on the same semiconductor substrate 1. MOSFET $Q_2$ is an n-channel transistor formed in p-well region 2 and MOSFET $Q_1$ is a p-channel transistor formed in n type substrate 1. MOSFET $Q_1$ includes p+ drain region 4 and p+ source region 6; MOSFET $Q_2$ includes n+ drain region 10 and n+ source region 12. The source of MOSFET $Q_2$ is connected to voltage source $V_{SS}$ via a disconnect device, such as fuse F. Although the disconnect device shown in FIG. 1 is a fuse, it would be apparent to one of ordinary skill in the art to use an antifuse as generally described in further detail below. The disconnect device of the programmable circuit is connected to the semiconductor device of the redundant electrical circuit, e.g., MOSFET $Q_2$, so that the semiconductor device is disconnected from the redundant electrical circuit upon actuation of the disconnect device. For example, in the case of fuse F, the blowing or opening of fuse F disconnects MOSFET $Q_2$ from the redundant electrical circuit in which this MOSFET $Q_2$ is connected.

In the present invention, an intrinisic SCR (formerly parasitic) on semiconductor substrate 1 is used to advantage to control the actuation of the disconnect device or fuse F. As a result, the area of the programmable circuit can be kept small and a large transistor is not required to provide the current necessary to actuate the disconnect device. An SCR intrinsic to the CMOS structure (formerly parasitic) is formed by intrinsic (formerly parasitic) npn transistor 14 formed in p-well region 2 and intrinsic (formerly parasitic) pnp transistor 16 formed in n substrate 1. The anode of the SCR is formed by the emitter of pnp transistor 16 which is connected to voltage source $V_{DD}$ and the cathode is formed by the emitter of npn transistor 14 which is connected to voltage source $V_{SS}$ via fuse F. The gate of the SCR is formed by the collector of pnp transistor 16 and the base of npn transistor 14. This gate is connected to MOSFET $Q_1$ to receive programming signal $\overline{P}$ by connector T. Connector T connects p+ region 6 of MOSFET $Q_1$ to p-well region 2 via p+ region 8 as shown in FIG. 3. The use of connector T enables the SCR of the semiconductor substrate to function as a switch in response to programming signal $\overline{P}$.

The SCR is biased by the connection of voltage sources $V_{DD}$ and $V_{SS}$ to the bipolar transistors in the manner shown in FIGS. 1–3. Voltage source $V_{DD}$ is connected to n substrate 1 via n+ region 9 so that this voltage is applied to the base of pnp transistor 16 and collector of npn transistor 14 via resistance $R_n$. Voltage source $V_{SS}$ is connected to p-well region 2 via p+ region 11 so that this voltage is applied to the gate of the SCR via resistance $R_p$. Thus, when programming signal $\bar{P}$ is received and applied to the gate of the SCR, the SCR enables the current through fuse F to rapidly increase to thereby blow fuse F and disconnect MOSFET $Q_2$.

An explanation of the operation of the programmable circuit of FIGS. 1–3 will now be given. When a low voltage programming signal $\bar{P}$ is applied to the input terminal of the programmable circuit, p-channel MOSFET $Q_1$ turns on, which supplies current to p-well 2 through resistance $R_P$ (a spreading resistance which is typically a few thousand ohms, but can vary widely with process conditions and layout geometries) and also through the base of the npn bipolar transistor. This npn base current actuates the SCR formed by the merged npn and pnp bipolar transistors 14 and 16, and causes a very high current (SCR on-resistance can be set to less than 10 ohms) to flow in a first impurity region of first conductivity type, such as a n+ emitter, and hence, in a disconnect device such as fuse F or an antifuse (but see FIGS. 6, 8, 10 and 16 for more suitable circuits, since the antifuse breakdown voltage must be overcome). If the fuse current exceeds a critical level, the fuse blows (i.e., becomes an open circuit), and this in turn automatically turns off the SCR. And if an antifuse is used, and the antifuse breakdown current exceeds a critical level, the antifuse functions as a short circuit. Of course, in the case of an antifuse, actuation of the antifuse does not automatically turn off the SCR or thyrister. Thus, as apparent to one of ordinary skill in the art, when using an antifuse, the current available from $V_{DD}$ is controlled externally and it is applied for a predetermined period of time.

For polysilicon fuses, the critical current density is approximately $1.7 \times 10^7$ A/cm$^2$ when covered by passivating overglass, and $7 \times 10^6$ A/cm$^2$ when unpassivated. For typical dimensions such as 0.25 micron polysilicon layer thickness and 2 micron linewidth, critical currents of 85 mA and 35 mA are obtained for the passivated and unpassivated cases, respectively. With these figures, the advantages of the present invention can be clearly understood. First, the SCR or thyristor itself consumes almost no useful layout area, since it is composed of parasitic elements. The extra p+/p-well trigger contact 8 is the only portion of the SCR not used in an additional capacity, since p-channel MOSFET $Q_1$ is used to provide the trigger current, and a second MOSFET, such as n-channel MOSFET $Q_2$, is used as part of the circuit which detects whether or not programming has taken place. The p-channel MOSFET $Q_1$ need only be large enough to supply a few hundred microamperes, which can be done by a minimum geometry (W/L=1) device in most cases. FIG. 2 shows a conservative case where W/L=4. If a conventional method were used (i.e., a large n-channel transistor to supply the fuse blowing current), the switching device would require a W/L ratio of not less than 140 (unpassivated) or 60 (passivated) in a very advanced 250 Angstrom gate oxide process. Practically, the device would have to be much larger to allow adequate margin, and larger still if the process gate oxide were thicker than 250 Angstrom. Typically, then, the programmable circuit of the present invention reduces the area of the programmable circuit by at least one order of magnitude, and probably much more, since the dominant use of area in this invention is by the triggering device. FIGS. 1 and 2 also show that additional probe pads (PAD) are not necessary for the operation of the programmable circuit, but such extra pads might be used to advantage in certain other embodiments. The programmable circuit can also be designed not to require a supply voltage in excess of 5 v (conventional implementations usually must), although embodiments employing a modest increase (e.g., to 7 v) can enjoy greater circuit margin. This is due primarily to the fact that a fuse, particularly one made of polysilicon, requires not only current but voltage in order to be blown. A typical value for a polysilicon fuse of 2.0 micron length (narrowest portion) is 0.9 v (unpassivated) or 2.1 v (passivated), again using the previously cited critical current data and typical values for n++ polysilicon resistivity.

Figure 4:
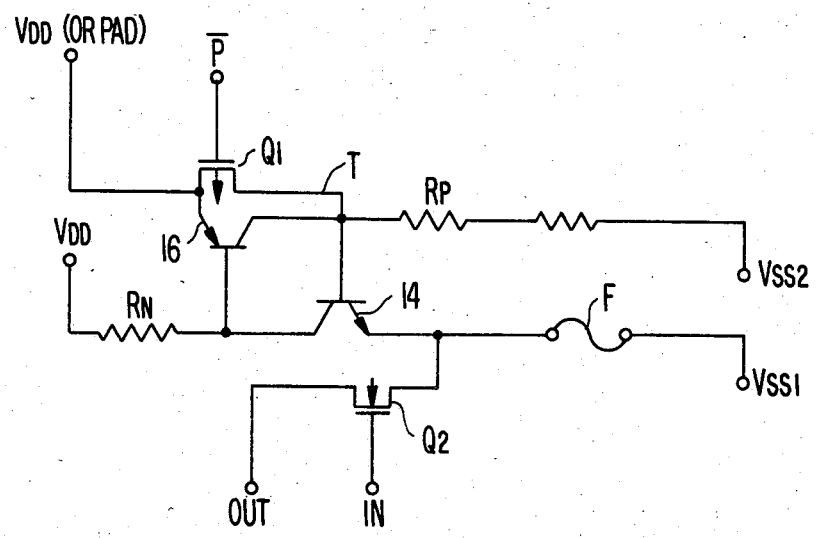
FIGS. 4, 6, 8, 10, 12, 14 and 16 are circuit diagrams of a semiconductor device according to other embodiments of the present invention.
Figure 5:
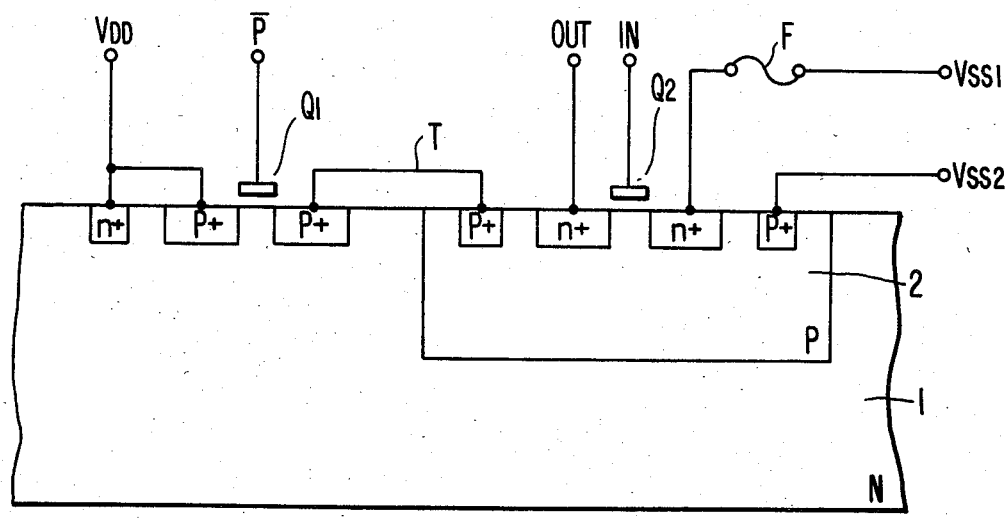
FIGS. 5, 7, 9, 11, 13, 15 and 17 are sectional views of a semiconductor device according to the embodiments of FIGS. 4, 6, 8, 10, 12, 14 and 16, respectively, of the present invention.
Figure 6:
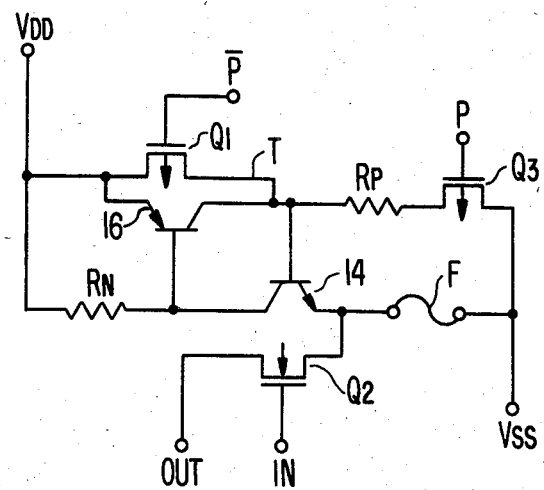
Figure 7:
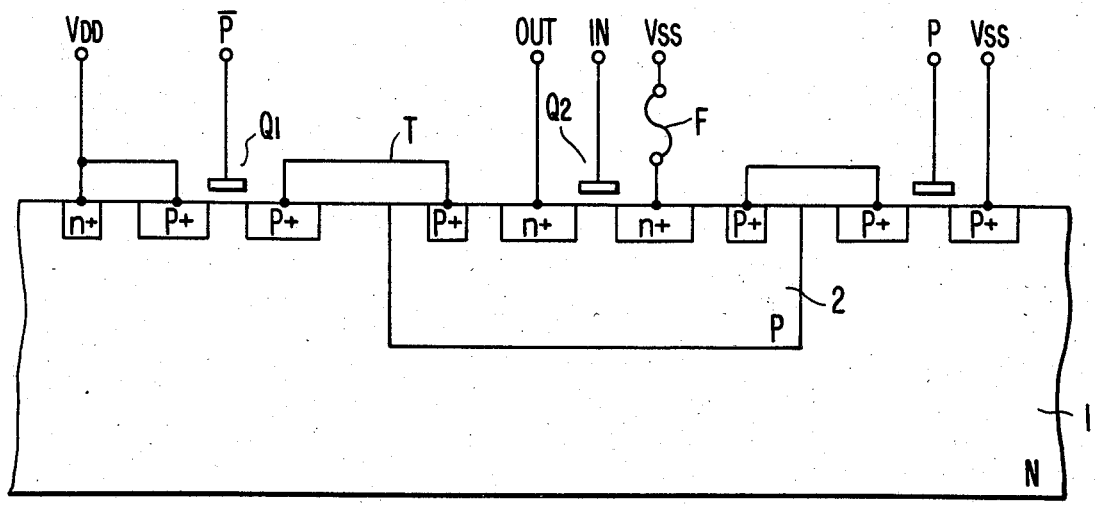

The remaining figures are now described in detail. FIGS. 4–5 show an embodiment where the common terminal of fuse F is not connected to the same $V_{SS}$ supply voltage which provides the p-well ground potential. Voltage source $V_{SS1}$ is connected to fuse F and voltage source $V_{SS2}$ is connected to the gate of the SCR. This programmable circuit is particularly suitable for cases of higher fuse resistance (or antifuses, which require a drop of at least a breakdown voltage, which must be well above the normal supply voltage) when the negative feedback effect of emitter lead resistance might interfere with SCR or thyristor operation. Voltage source $V_{SS2}$ is shown connected to p-well 2 by a p+ region because a floating p-well is undesirable during normal circuit operation. During programming, if voltage source $V_{SS2}$ is allowed to float, the negative feedback effect of fuse (or antifuse) impedance will be eliminated. Thus, if $V_{SS2}$ is open when programming signal $\bar{P}$ is applied, then the fuse will blow at a faster rate than in the circuit of FIGS. 1–3.

Figure 8:
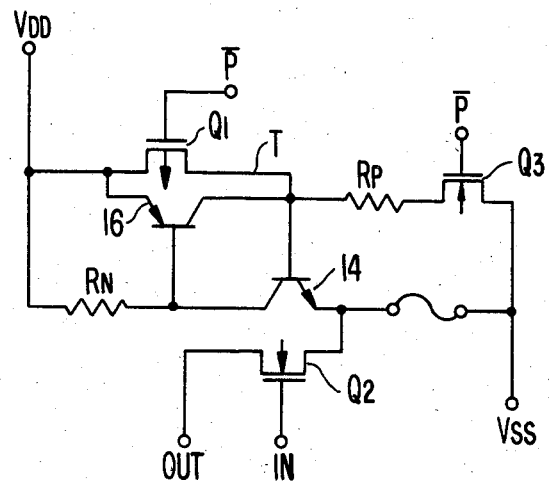
Figure 9:
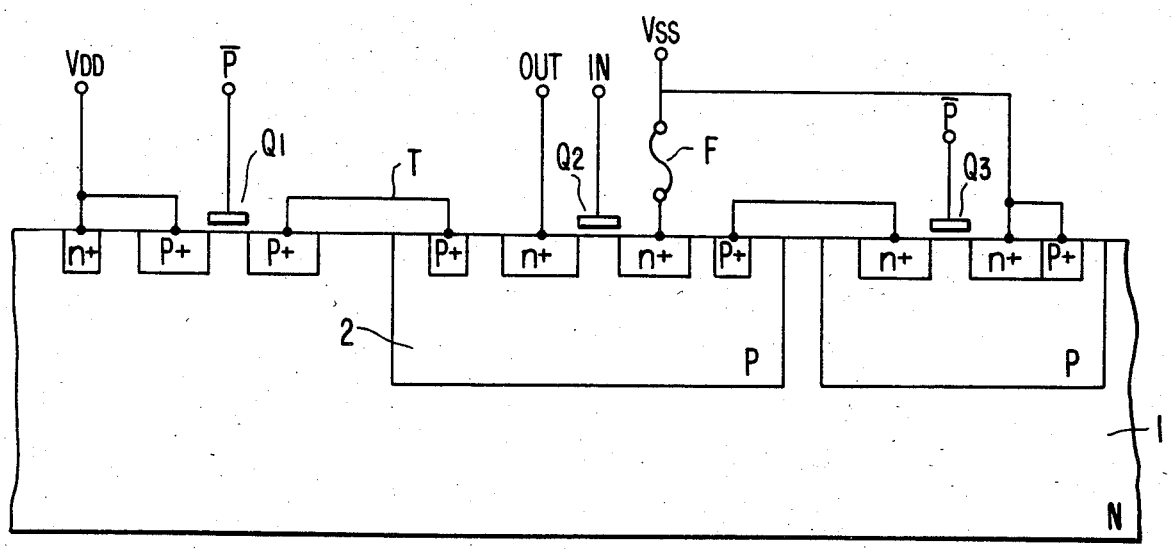

Alternatives to the technique illustrated in FIG. 4 are shown in FIGS. 6–7 and 8–9. These two circuits avoid the use of voltage source $V_{SS2}$, any extra pads, and any floating p-wells other than the one containing the fuse or antifuse to be programmed. In FIGS. 6–7 and 8–9, voltage source $V_{SS}$ is supplied to p-well 2 through a second MOSFET such as p-channel MOSFET $Q_3$ gated by programming signal P (the inverse of $\bar{P}$) (FIG. 6) or n-channel MOSFET $Q_3$ gated by $\bar{P}$ (FIG. 8). Thus, the MOSFET $Q_3$ which supplies voltage source $V_{SS}$ is turned off during programming (application of pulse to blow the fuse), allowing the p-well containing the element to be programmed to float. The MOSFET $Q_3$ is turned on at all other times in order to supply $V_{SS}$. For a 250 Angstrom gate oxide process, a reasonable transistor on-resistance of about 2000 ohms can be obtained using an aspect ratio W/L of 13 (p-ch) or 4.5 (n-ch).

Figure 10:
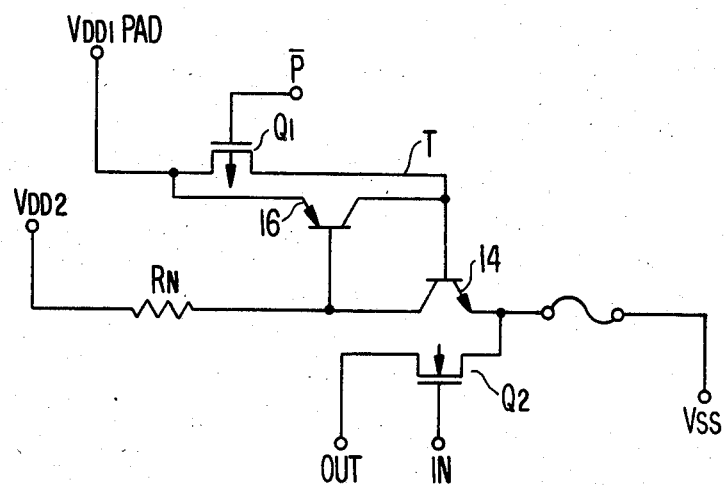
Figure 11:
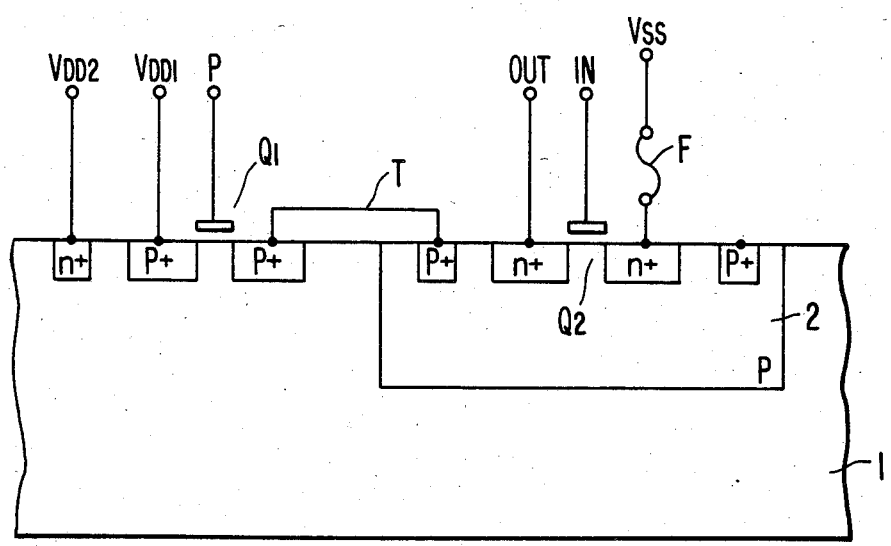
Figure 12:
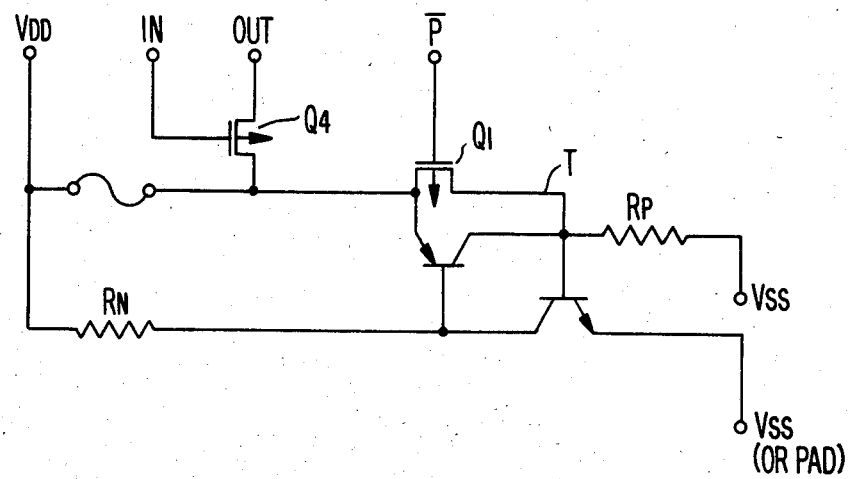
Figure 13:
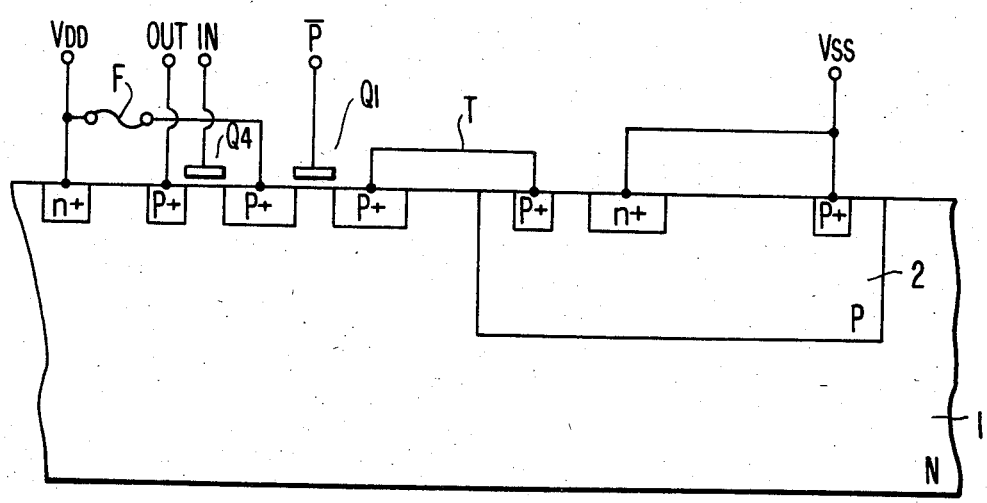

FIGS. 10–11 illustrate yet another method of temporarily allowing p-well 2 to float without using an additional power supply. In this case, PAD is set to voltage source $V_{DD1}$ (e.g., $V_{DD1}$ is equal to 5 v) and n type semiconductor substrate 1 is set to voltage source $V_{DD2}$ (e.g., $V_{DD2}$ is equal to 5 v) during programming. During normal circuit operation, voltage source $V_{DD1}$ is floating and voltage source $V_{DD2}$ is equal to 5 v, and all $\bar{P}$ signals are kept low, thus keeping the p-channel triggering transistor (MOSFET $Q_1$) on so that it can supply $V_{SS}$ to p-well 2.

Figure 14:
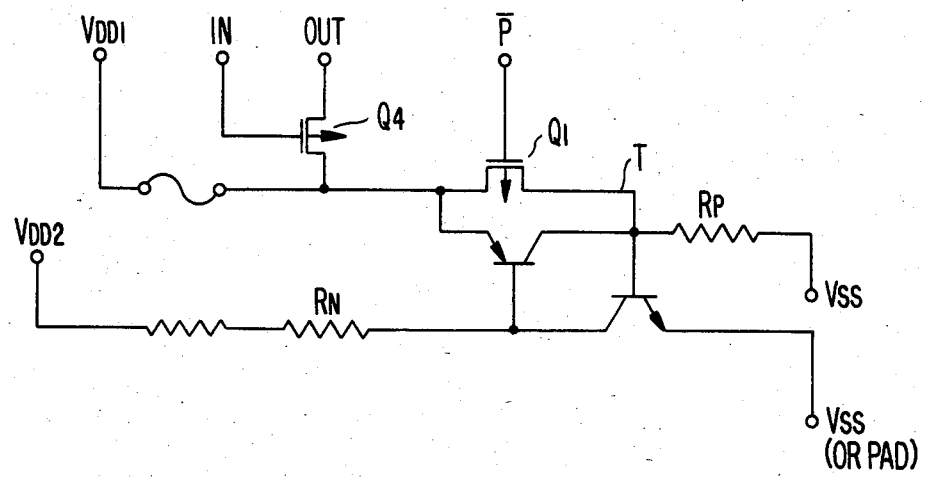
Figure 15:
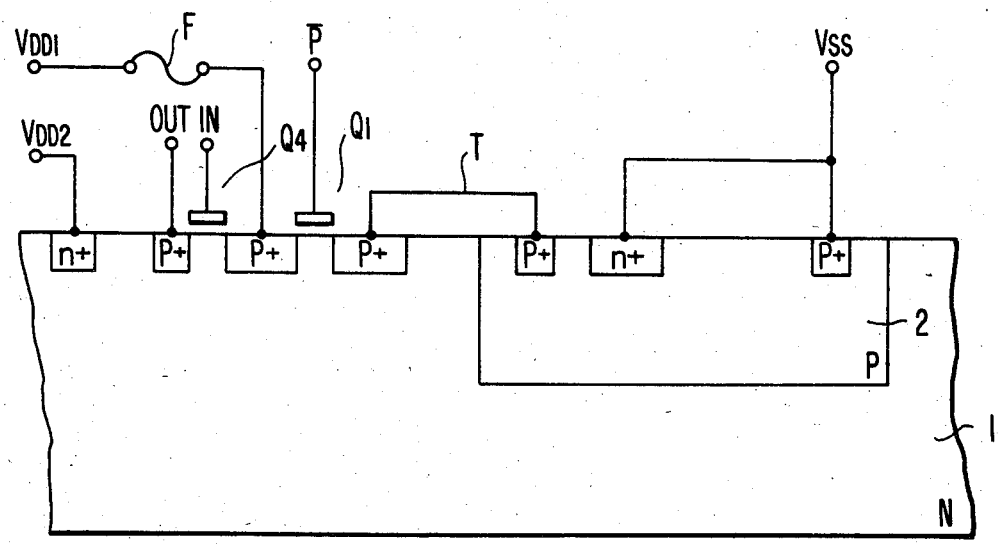

FIGS. 12-13 and 14-15 are analogous to FIGS. 1 and 3, respectively, except that the fuse or antifuse is now connected to voltage source $V_{DD}$ on the opposite side of the SCR. In FIG. 14, voltage source $V_{DD2}$ is not strictly necessary because substrate region 1 is ubiquitous and is usually contacted in many locations. Thus, additional local contacts merely serve to reduce the effective substrate spreading resistance as seen from a particular point. For this reason, perfect substrate floating cannot be obtained, and the circuit of FIG. 14 will not be nearly as effective as that of FIG. 3 for programming antifuses.

Figure 16:
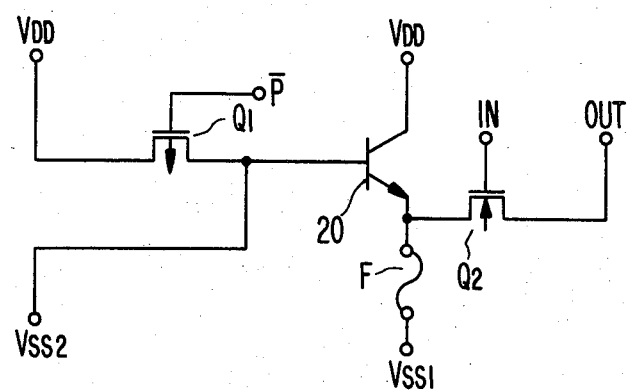
Figure 17:
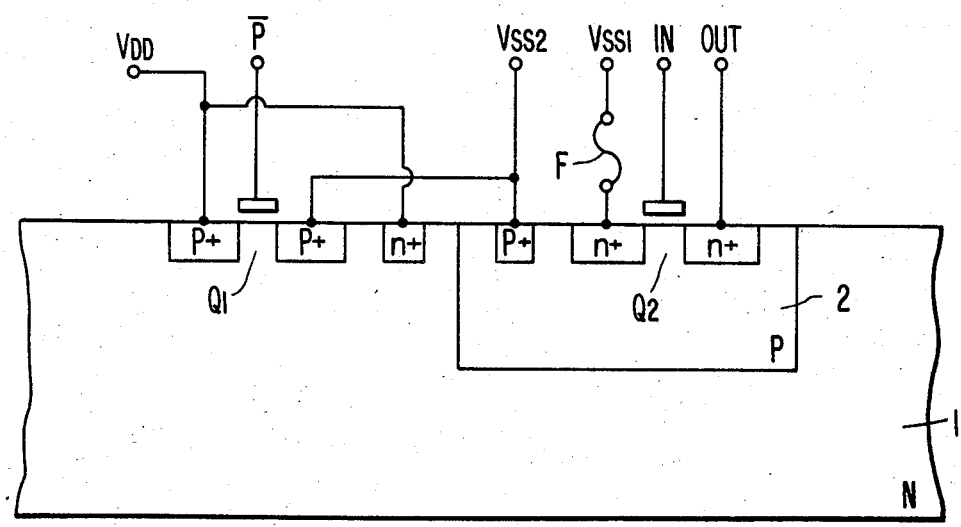

FIGS. 16-17 show a similar programmable circuit utilizing the same concept, but not requiring the complete thyristor or SCR. This circuit may be used in a CMOS process or layout which has been specially designed so that the SCR cannot be turned on, such as a p-well process using an n-epitaxial layer on an n+ substrate which is directly contacted to voltage source $V_{DD}$ from the backside. Without the backside contact, the SCR can almost always operate, even in an epitaxial process. However, in this programmable circuit, a high current gain (usually well over 100 in common emitter mode) bipolar transistor 20 is used to supply the programming current to fuse F. P-channel MOSFET $Q_1$, which is coupled to the base of bipolar transistor 20 and is responsive to programming signal $\overline{P}$, must supply somewhat larger turn-on current than in the above case of the SCR. MOSFET $Q_1$ also must remain on until programming has been completed, rather than just until the SCR fires as in the above case. Voltage source $V_{SS2}$, which typically would float during programming, provides a voltage to p-well 2 during normal circuit operation. Voltage sources $V_{SS1}$ and $V_{SS2}$ are both ground under normal operating conditions. When programming, however, $V_{SS2}$ is allowed to float, and programming signal $\overline{P}$ is driven low. This forces a base current into bipolar transistor 20 and a much larger emitter current then flows through (and blows) fuse F. An antifuse can be used as described above, provided voltage source $V_{DD}$ is high enough to overcome the antifuse breakdown voltage and still supply the base current. In the antifuse case, bipolar transistor 20 does not turn off automatically, so current is controlled both in magnitude and time duration by an external circuit (not shown).

Although illustrative embodiments of the invention have been described in detail with reference to the accompanying drawings, it is to be understood that the invention is not limited to those precise embodiments. Various changes and modifications can be effected therein by one skilled in the art without departing from the scope or spirit of the invention. For example, as previously stated, adaptations of the schematics, sectional views and layouts of FIGS. 1-16 to n-well CMOS or bipolar technologies would be apparent to one skilled in the art. The extension to an n-channel MOS process which has been modified to include n-wells and p-channel transistors also would be apparent.

I claim:

1. A programmable circuit for a semiconductor device formed on a semiconductor substrate for use in a redundant electrical circuit, said programmable circuit comprising:

an input terminal to receive a programming signal;

a switching device parasitic to said semiconductor device and intrinsic to the structure of said semiconductor substrate, said switching devices being coupled to said input terminal to generate a voltage output in response to receipt of the programming signal by said input terminal; and disconnect means coupled to said semiconductor device and responsive to the voltage output generated by said switching device for disconnecting said semiconductor device from said redundant electrical circuit in response to the programming signal.

2. A programmable circuit according to claim 1 wherein said semiconductor device is a CMOS semiconductor device and said switching device is a bipolar transistor on said semiconductor substrate.

3. A programmable circuit according to claim 1 wherein said semiconductor device is a CMOS semiconductor device and said switching device is an SCR on said semiconductor substrate.

4. A programmable circuit according to claim 3 wherein said SCR comprises a npn bipolar transistor and a pnp bipolar transistor combined together to form the anode, cathode and gate of said SCR, said gate being responsive to the programming signal to turn on the anode-cathode current path of said SCR to actuate said disconnect means.

5. A programmable circuit according to claim 4 wherein the base of said pnp transistor is connected to the collector of the npn transistor, the anode of said SCR is formed by the emitter of said pnp bipolar transistor, the gate of said SCR is formed by the connection of the collector of said pnp bipolar transistor and the base of said npn bipolar transistor and the cathode of said SCR is formed by the emitter of said npn bipolar transistor, said anode being connected to said disconnect means and said gate being responsive to the programming signal to turn on said SCR to actuate said disconnect means.

6. A programmable circuit according to claim 4 wherein the base of said pnp transistor is connected to the collector of the npn transistor, the anode of said SCR is formed by the emitter of said pnp bipolar transistor, the gate of said SCR is formed by the connection of the collector of said pnp bipolar transistor and the base of said npn bipolar transistor and the cathode of said SCR is formed by the emitter of said npn bipolar transistor, said cathode being connected to said disconnect means and said gate being responsive to the programming signal to turn on said SCR to actuate said disconnect means.

7. A programmable circuit according to claim 4 wherein a first MOSFET is connected between said gate of said parasitic SCR and a first voltage source, said first MOSFET having a control terminal connected to said input terminal, said first MOSFET being responsive to the programming signal received by said input terminal and said control terminal to connect said gate of said SCR to said first voltage source to turn on said SCR.

8. A programmable circuit according to claim 7 wherein said disconnect means is a fuse.

9. A programmable circuit according to claim 7 wherein said disconnect means is an antifuse.

10. A programmable circuit according to claim 7 wherein said first MOSFET is a p channel MOSFET.

11. A programmable circuit according to claim 7 wherein said first MOSFET is an n channel MOSFET.

12. A programmable circuit according to claim 7 wherein said semiconductor device is used to check whether said disconnect means has been activated.

13. A programmable circuit according to claim 7 wherein a second MOSFET is connected between said gate of said SCR and a second voltage source, said second MOSFET being responsive to the programming signal to disconnect said gate of said SCR from said second voltage source upon actuation of said SCR by the programming signal.

14. A programmable circuit according to claim 13 wherein said second MOSFET is formed in said semiconductor substrate and has a first impurity region connected to said gate of said SCR and a second impurity region connected to said second voltage source.

15. A programmable circuit according to claim 7 wherein a second voltage source is connected to said gate of said SCR during normal operation of said programmable circuit by a second MOSFET, said second MOSFET having a control terminal connected to said input terminal, said second MOSFET being responsive to the programming signal received by said terminal and said control terminal to disconnect said gate of said SCR from said second voltage source, said programmable circuit further comprising a third voltage source connected to said disconnect means and responsive to said SCR to actuate said disconnect means to disconnect said semiconductor device.

16. A programmable circuit according to claim 7 wherein said semiconductor substrate is of a first conductivity type and said SCR is formed in a semiconductor region in said semiconductor substrate of a second conductivity type, said first MOSFET having two impurity regions and a gate electrode responsive to said programming signal and formed in said semiconductor substrate, said programmable circuit further comprising a first impurity region of said first conductivity type formed in said semiconductor region of said second conductivity type, connecting means connected between said semiconductor region and one of said two impurity regions of said first MOSFET, said first voltage source being connected to the other of said two impurity regions of said first MOSFET and to said semiconductor substrate, and a second voltage source connected to said first impurity region in said semiconductor region and to said semiconductor region, said disconnect means being inserted in a current path between said first and second voltage sources.

17. A programmable circuit according to claim 4 wherein a first voltage source is connected across the anode and cathode of said SCR and a second voltage source is connected to the base of said pnp bipolar transistor during normal operation of said programmable circuit and disconnected at the time the programming signal is applied to said input terminal.

18. A programmable circuit for a semiconductor device formed on a semiconductor substrate for use in a redundant electrical circuit, said programmable circuit comprising:

an input terminal to receive a programming signal;

a switching device parasitic to said semiconductor device and intrinsic to the structure of said semiconductor substrate, said switching device being coupled to said input terminal to generate a voltage output in response to receipt of the programming signal by said input terminal; and connect means coupled to said semiconductor device and responsive to the voltage output generated by said switching device for connecting said semiconductor device to said redundant electrical circuit in response to the programming signal.

* * * * *